United States Patent
Palumbo et al.

(10) Patent No.: US 10,199,370 B2
(45) Date of Patent: Feb. 5, 2019

(54) ELECTRONIC DEVICE WITH INTEGRATED GALVANIC ISOLATION, AND MANUFACTURING METHOD OF THE SAME

(71) Applicant: STMicroelectronics S.r.l., Agrate Brianza (IT)

(72) Inventors: Vincenzo Palumbo, Vimercate (IT); Elisabetta Pizzi, Limbiate (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 15/900,041

(22) Filed: Feb. 20, 2018

(65) Prior Publication Data

US 2018/0190646 A1 Jul. 5, 2018

Related U.S. Application Data

(62) Division of application No. 15/279,050, filed on Sep. 28, 2016, now Pat. No. 9,935,098.

(30) Foreign Application Priority Data

Mar. 25, 2016 (IT) .................... 102016000031731

(51) Int. Cl.
*H01L 27/02* (2006.01)
*H01L 49/02* (2006.01)
(Continued)

(52) U.S. Cl.
CPC ........ *H01L 27/0288* (2013.01); *H01L 21/283* (2013.01); *H01L 21/76883* (2013.01);
(Continued)

(58) Field of Classification Search
CPC ............ H01L 27/0288; H01L 23/5227; H01L 23/5223
See application file for complete search history.

(56) References Cited

U.S. PATENT DOCUMENTS

| 2008/0290444 A1 | 11/2008 | Crawley et al. |
| 2011/0176339 A1 | 7/2011 | Kerber et al. |

(Continued)

FOREIGN PATENT DOCUMENTS

| EP | 2 658 126 A1 | 10/2013 |
| EP | 2 775 522 A1 | 9/2014 |

OTHER PUBLICATIONS

Chen, "*i* Coupler® Products with *iso*Power™ Technology: Signal and Power Transfer Across Isolation Barrier Using Microtransformers," Analog Devices, 2006, 4 pages.

*Primary Examiner* — Anthony Ho
(74) *Attorney, Agent, or Firm* — Seed IP Law Group LLP

(57) ABSTRACT

A method of manufacturing an electronic device for providing galvanic isolation includes forming a dielectric layer on a semiconductor body and integrating, in the dielectric layer, a galvanic isolation module, the integrating including forming a first metal region at a first height of the dielectric layer. A second metal region is formed at a second height greater than the first height of the dielectric layer, the first and second metal regions being at least one of capacitively and magnetically coupleable together. Forming the second metal region includes etching selective portions of the dielectric layer to form at least one trench having a side wall coupled to a bottom wall through rounded surface portions, and filling each trench with metal material to form the second metal region having rounded edges.

20 Claims, 9 Drawing Sheets

(51) Int. Cl.
*H01L 23/522* (2006.01)
*H01L 23/00* (2006.01)
*H01L 21/768* (2006.01)
*H01L 21/283* (2006.01)
*H01L 23/48* (2006.01)
*H04L 25/02* (2006.01)

(52) U.S. Cl.
CPC ............ *H01L 23/48* (2013.01); *H01L 23/481* (2013.01); *H01L 23/5222* (2013.01); *H01L 23/5223* (2013.01); *H01L 23/5226* (2013.01); *H01L 23/5227* (2013.01); *H01L 24/48* (2013.01); *H01L 28/60* (2013.01); *H04L 25/026* (2013.01); *H01L 24/49* (2013.01); *H01L 2224/481* (2013.01); *H01L 2224/48463* (2013.01); *H01L 2224/49107* (2013.01)

(56) References Cited

U.S. PATENT DOCUMENTS

2013/0277797 A1 10/2013 Menath et al.
2013/0278372 A1 10/2013 Stecher et al.
2013/0280879 A1 10/2013 Stecher et al.

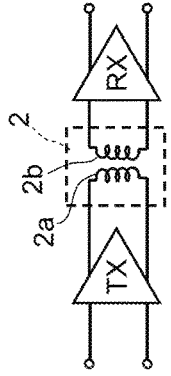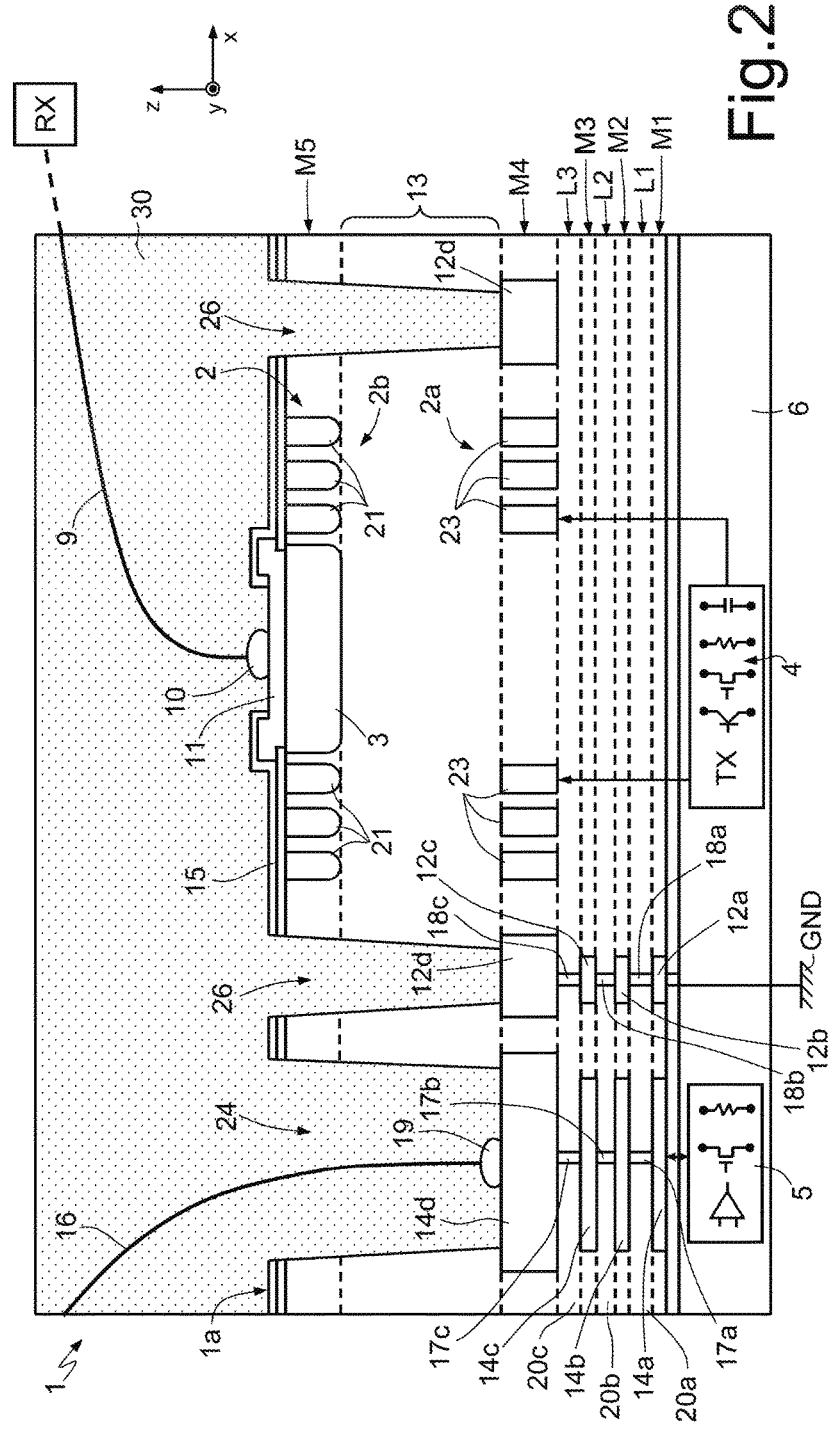

ELECTRONIC DEVICE WITH INTEGRATED GALVANIC ISOLATION, AND MANUFACTURING METHOD OF THE SAME

BACKGROUND

Technical Field

The present disclosure relates to an electronic device including a galvanic isolation module and to a manufacturing method of the same.

Description of the Related Art

In the field of galvanic isolation, for safety reasons, many power applications directly connected to high-voltage lines, such as systems for driving industrial machinery or household appliances, or control systems for motors and battery packs of electric vehicles, require decoupling between the power stage and the user control panel. Traditionally, in these applications, galvanic isolation has been obtained by optical couplers with isolation classes of several kilovolts and bandwidths of hundreds of kilohertz, or by coreless transformers on printed-circuit boards (PCBs).

In the field of integrated transformers for signal transmission, in order to obtain large bandwidths and reduce the size and costs, there have been recently introduced integrated coreless transformers. Design of transformers of this type requires the need to take into consideration numerous parameters, such as the breakdown voltage (also known as "dielectric rigidity"), the bandwidth, the time derivative of the voltage dV/dt, and the immunity to external fields.

In the field of integrated transformers for power transmission, in order to supply the driving system connected to the high-voltage power MOS transistor, it is desirable to use a power transmission line between the low-voltage (LV) portion and the high-voltage (HV) portion. In order to reduce the power losses and increase the efficiency of the system, it is important to reduce the resistance of the winding and the value of parasitic capacitance that is set up with the substrate. Currently, windings of a material with low resistance (typically, gold) and dedicated high-resistance substrates are used. This solution may not be employed in integrated circuits of a "smart power" type, with consequent increase in costs and loss of efficiency of the system as a whole.

There is hence felt the need for an integrated transformer that will overcome the drawbacks of the known art and in particular will make it possible to improve the isolation voltage class, will enable decoupling (galvanic isolation) between a low-voltage operating region and high-voltage operating region of the integrated circuit, will enable power transfer between the low-voltage operating region and the high-voltage operating region, and will, in general, enable a reduction of the costs and an improvement in performance.

BRIEF SUMMARY

Embodiments of the present disclosure provide an electronic device with galvanic isolation and a manufacturing method of the same that achieve the aforementioned purposes and that overcomes at least some of the disadvantages of the known art.

BRIEF DESCRIPTION OF THE SEVERAL VIEWS OF THE DRAWINGS

For a better understanding of the present disclosure, some embodiments thereof will now be described, purely by way of non-limiting example and with reference to the attached drawings, wherein:

FIG. 1 shows a system that comprises a galvanically isolated coupling module, in particular a transformer;

FIG. 2 illustrates, in lateral sectional view, a device including a micro-integrated transformer according to one embodiment of the present disclosure;

DETAILED DESCRIPTION

Figure 3:
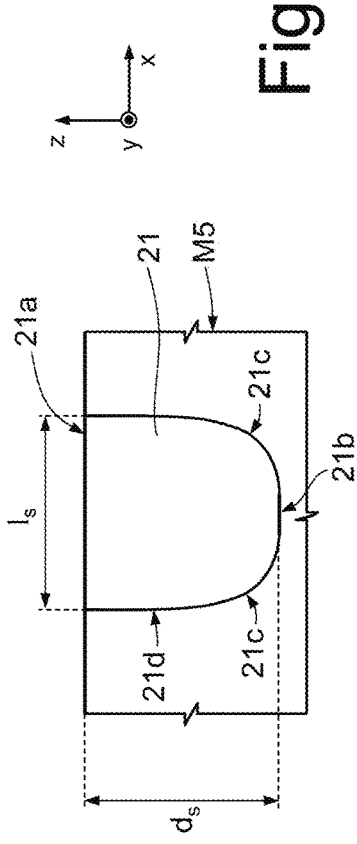
FIG. 3 shows an enlarged detail of a portion of a turn of the top winding of the micro-transformer of FIG. 2.

FIG. 1 is a schematic illustration of a system for transceiving an electrical signal based upon inductive coupling and configured in such a way that a transmitter TX is galvanically isolated from a receiver RX by a transformer, in particular a micro-transformer, 2. In this context, the term "micro-transformer" indicates a transformer manufactured according to the technology for the production of integrated circuits.

The system of FIG. 1 may be used for the transmission of electrical signals (e.g., data signals, signals of an impulsive type, etc.) from the transmitter TX to the receiver RX. Moreover, it is possible to transfer power through the transformer 2, or use the transformer 2 for translation of a signal between two different voltage levels. In industrial applications, the system of FIG. 1 may moreover be used for high-voltage driving circuits, for communication and control systems, measurement systems, and testing systems. Since the signals, of whatever kind they may be, are transmitted through the galvanic isolation, any conductive path type between the transmitter TX and the receiver RX that is to be isolated is eliminated.

In use, the transmitter TX receives an input signal (to be transmitted) from a control circuitry, and supplies the input signal to a primary winding 2a; the receiver RX is coupled for receiving from the secondary winding 2b a signal corresponding to the input signal supplied to the primary winding 2a and generates an output signal comprising a reconstructed input signal.

With reference to FIG. 2, illustrated in lateral sectional view and in a triaxial reference system X, Y, Z is an electronic device, or chip, 1 including the micro-transformer 2, of an integrated type, and a signal-transmission unit TX, according to one embodiment of the present disclosure. The transformer 2 includes a bottom winding 2a (primary winding) and a top winding 2b (secondary winding), which are here represented by way of example as each having three turns designated by the references 21 and 23, respectively. According to the present disclosure, the transmitter TX and the receiver RX, as likewise the primary and secondary windings, may be swapped round. Moreover, the transmitter TX and the receiver RX may both be transceiver modules, configured to function in transmission or reception according to the need. It is, however, evident that the number of turns may be other than three, and chosen according to the need, for example in a number comprised between 2 and 30. The bottom winding 2a and top winding 2b extend at a distance from one another along the axis Z, separated by one or more layers of dielectric material (e.g., silicon oxide). An electrical-contact region 3, of metal material, extends on the same metal level as that of the top winding 2b, inside the turns 21 thereof and electrically coupled to the turns 21 of the top winding, and is thus electrically coupled to the top winding 2b. The electrical-contact region 3 is moreover electrically coupled to a bonding wire 9 by a bonding region 10 and a coupling-interface region 11 for transferring an electrical signal to the receiver RX external to the device 1. Since, according to one aspect of the present disclosure, the electrical-contact region 3 is of copper, the coupling-interface region 11 (made, for example, of aluminum) has the function of preventing direct exposure of the copper to the external environment during the manufacturing steps. One or more dielectric layers 15 (just one of which is shown in the figure), made, for example, of silicon oxide and/or silicon nitride, cover the top winding 2b, protecting it and isolating it electrically.

The micro-transformer 2 functions as galvanic isolation module and as power-transfer interface between the transmitter TX, integrated in a semiconductor body 6 of the device 1, and the receiver RX, which is external to the device 1, or vice versa.

The transmitter TX includes, in a per se known manner and on the basis of the signal that is to be transmitted, electronic components/circuits designated as a whole by the reference numbers 4 and 5, which function at voltages ranging between 1 V and 40 V. The transmitter TX is operatively coupled to the bottom winding 2a, for supplying to the bottom winding 2a the signal to be transferred to the receiver RX. The electrical components and/or circuits 4 may be located in the region underlying the micro-transformer, as shown in the figure, or else staggered with respect to the micro-transformer.

The semiconductor body 6 (for example, including silicon) is, in particular, obtained in BCD (Bipolar-CMOS-DMOS) technology; i.e., it integrates three different technologies: bipolar technology for precise analog functions, CMOS (Complementary Metal Oxide Semiconductor) technology for digital circuits, and DMOS (Double Diffused Metal Oxide Semiconductor) technology for power and high-voltage components.

Extending on the substrate 6 are one or more metal levels. In the embodiment of FIG. 2, four metal levels M1-M4 are illustrated, each including respective metal regions 14a-14d. The fourth metal level M4 moreover includes the bottom winding 2a. A fifth metal level M5 includes the electrical-contact region 3 and the top winding 2b. Moreover, as illustrated in FIG. 2, the metal levels M1-M4 may include further metal regions, designated by the references 12a-12d.

According to one aspect of the present disclosure, in the dielectric region that extends between the bottom winding 2a and the substrate 6, electronic circuits and components may, at least in part, be formed. In this case, said region comprised between the bottom winding 2a and the substrate 6 is an active-area region of the device 1.

According to a different embodiment, the dielectric region that extends between the bottom winding 2a and the substrate 6 does not comprise electronic circuits or components. In this case, the micro-transformer 2 is formed alongside the active-area region of the device 1.

Extending between the fourth metal level M4 and the fifth metal level M5 is a thick dielectric layer 13, having a thickness, along Z, comprised between 1 µm and 30 µm, for example 15 µm. The thick dielectric layer 13 is the layer that separates the bottom winding 2a from the top winding 2b of the transformer 2, and its thickness is chosen as a function of, and such as to guarantee, the voltage class required of the galvanic isolation.

In order to expose the metal regions 12d, 14d of the fourth metal level M4 (in order to contact them electrically), trenches 24, 26 extend from a front side 1a of the device 1 in depth along Z, through the thick dielectric layer 13. The trench 24 exposes the metal region 14d, and the trench 26 exposes the metal region 12d. The metal region 14d of the metal level M4 forms one or more electrical-contact pads. In particular, the metal region 14d is electrically coupled to a bonding wire 16 by a bonding region 19. The bonding wire 16 and the bonding region 19 are of conductive metal material, for example gold. The metal region 12d has, instead, the function of guaranteeing an electrical contact with the material of the package (resin) of the chip and preventing accumulation of electric charge at the interfaces with the region 14.

Figure 11:
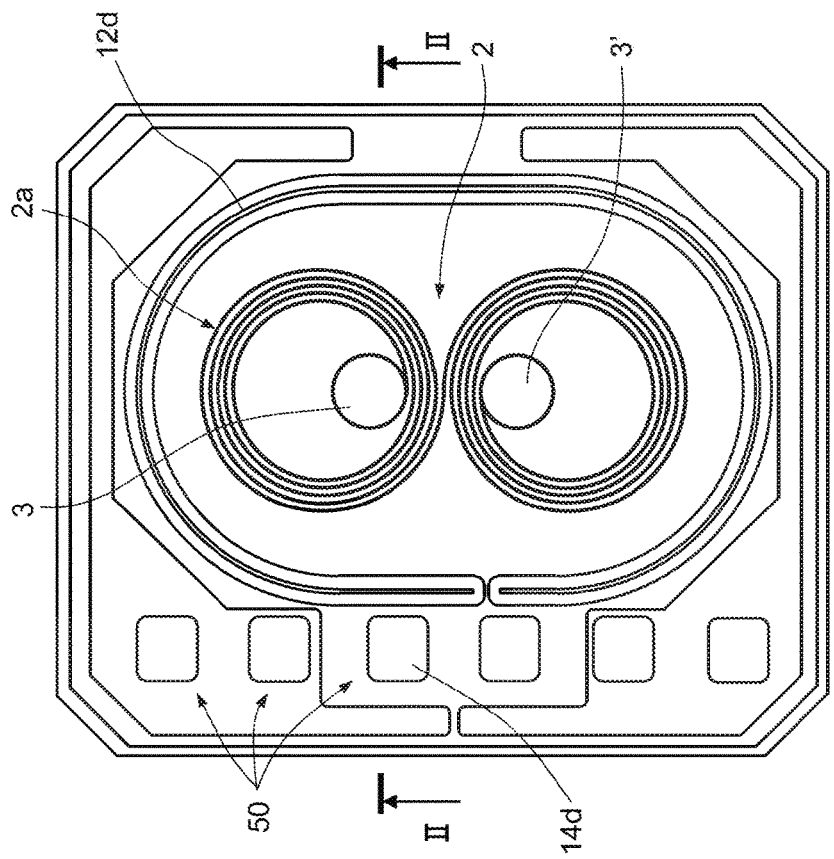
FIG. 11 shows, in top plan view, the device of FIG. 2, according to one embodiment.

In particular, as illustrated more clearly in FIG. 11, the metal region 12d (and hence also the trench 26) forms, in top plan view in the plane XY, a curvilinear path, in particular an annular path, and surrounds (completely or partially, according to respective embodiments) the bottom winding 2a of the transformer 2.

Each metal level M2-M4 is electrically coupled to the metal level M1-M3 below it by via levels L1-L3, which include conductive vias 17a-17c, 18a-18c. The conductive vias 17a-17c, 18a-18c are made, for example, of metal material. Dielectric layers 20a-20c, which are made, for example, of silicon oxide, extend between one metal level M1-M3 and the next metal level and alongside each metal region belonging to a same metal level M1-M4.

The substrate 6 may integrate several electrical and electronic components/circuits 5, which have specific functions and are not described in detail herein in so far as they do not form the subject of the present disclosure. Irrespective of the functions of said electronic circuits 5, conduction terminals thereof are electrically coupled with the outside of the device 1 via the metal regions 14a-14d and the conductive vias 17a-17c, for transmission/reception of electrical control signals for control thereof.

A layer of resin 30 (for example, epoxy resin) covers the device 1 and forms part of the package (not shown in its entirety) of the device 1. The layer of resin 30 penetrates into the trenches 24, 26 as far as the metal regions 12d, 14d.

According to an aspect of the present disclosure, the turns of the top winding 2b of the transformer 2 and, optionally, the electrical-contact region 3, are U-shaped in lateral sectional view. In greater detail, as shown in FIG. 3 (here a single turn 21 is illustrated), each turn 21 extends between an own top side 21a and an own bottom side 21b, which are parallel to one another and to the plane XY. The distance $d_s$ (along Z) between the top side 21a and the bottom side 21b is between 2 µm and 6 µm, for example 3 µm. The width $I_s$, along X, of each turn 21 is between 5 µm and 100 µm, for example 20 µm. Each turn 21 has, on the bottom side 21b, a rounded profile; i.e., it has rounded corners 21c that radius the bottom side 21b with a lateral surface 21d (parallel to the plane YZ) of the turn 21. The corners 21c have a radius of curvature $r_c$ of a value comprised between 1 µm and 6 µm, for example 3 µm.

The present applicant has found that, in use, the equipotential field lines in an area corresponding to the turns 21 follow the profile of the turns 21 and, hence, are curved at the rounded corners 21c following the radius of curvature thereof. The greater the radius of curvature of the rounded corners 21c, the smaller the value of electrical field at the corners 21c themselves. In fact, the electrical field has higher values in the proximity of the conductors on which there is greater density of equipotential lines, namely, in the proximity of the edges, tips, or areas with small radius of curvature. An excessive electrical field in these regions may cause damage to the device, such as early breakdown of the dielectric. Hence, the embodiment of FIGS. 2 and 3 overcomes this drawback by increasing the radius of curvature of the corners 21c of the turns 21. In particular, when a certain threshold is overstepped, the electrical field causes breakdown of the dielectric; however, even for not excessively high values, applied for prolonged times, the electrical field is at the basis of the mechanisms of degradation of the dielectric layer. Accurate calculations show that with a radius of curvature of 3 µm, for example, it is possible to reduce the edge electrical field by approximately three times as compared to a practically zero radius of curvature. For this reason, as the radius of curvature increases, the possibility of breakdown of the dielectric is reduced, and simultaneously the service life of the device increases.

FIGS. 4-10 illustrate, in lateral sectional view, steps for manufacturing the device 1 of FIG. 2, according to one aspect of the present disclosure.

Figure 4:
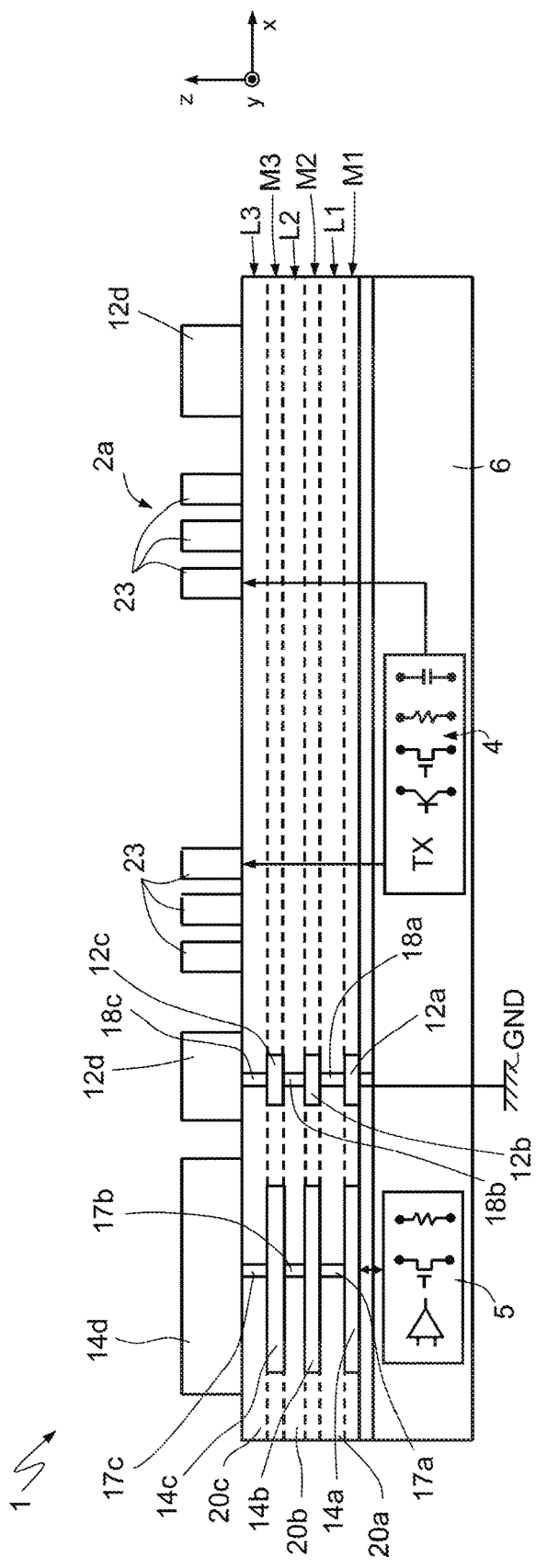
FIGS. 4-10 illustrate, in lateral sectional view, steps of manufacture of the device of FIG. 2.

FIG. 4 illustrates the device 1 in an initial manufacturing step, in which the substrate 6 has already been processed for integrating all the electrical and electronic functions required by the specific application, using any available micromachining technology. Extending over of the substrate, in a per se known manner, are the metallizations of the metal levels M1-M4, including the turns 23 of the bottom winding 2a of the transformer 2 (in the metal level M4).

Figure 5:
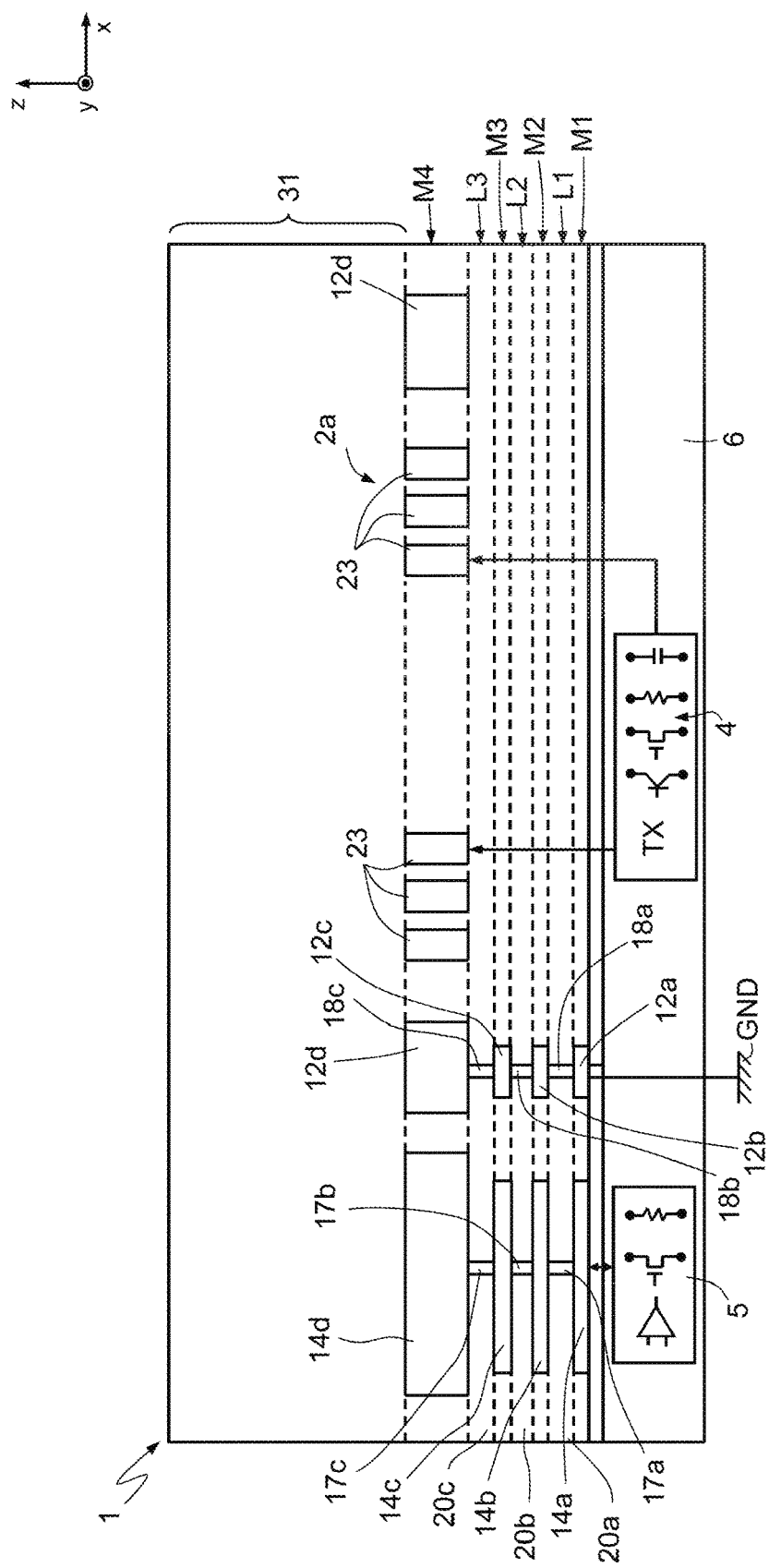
Figure 6:
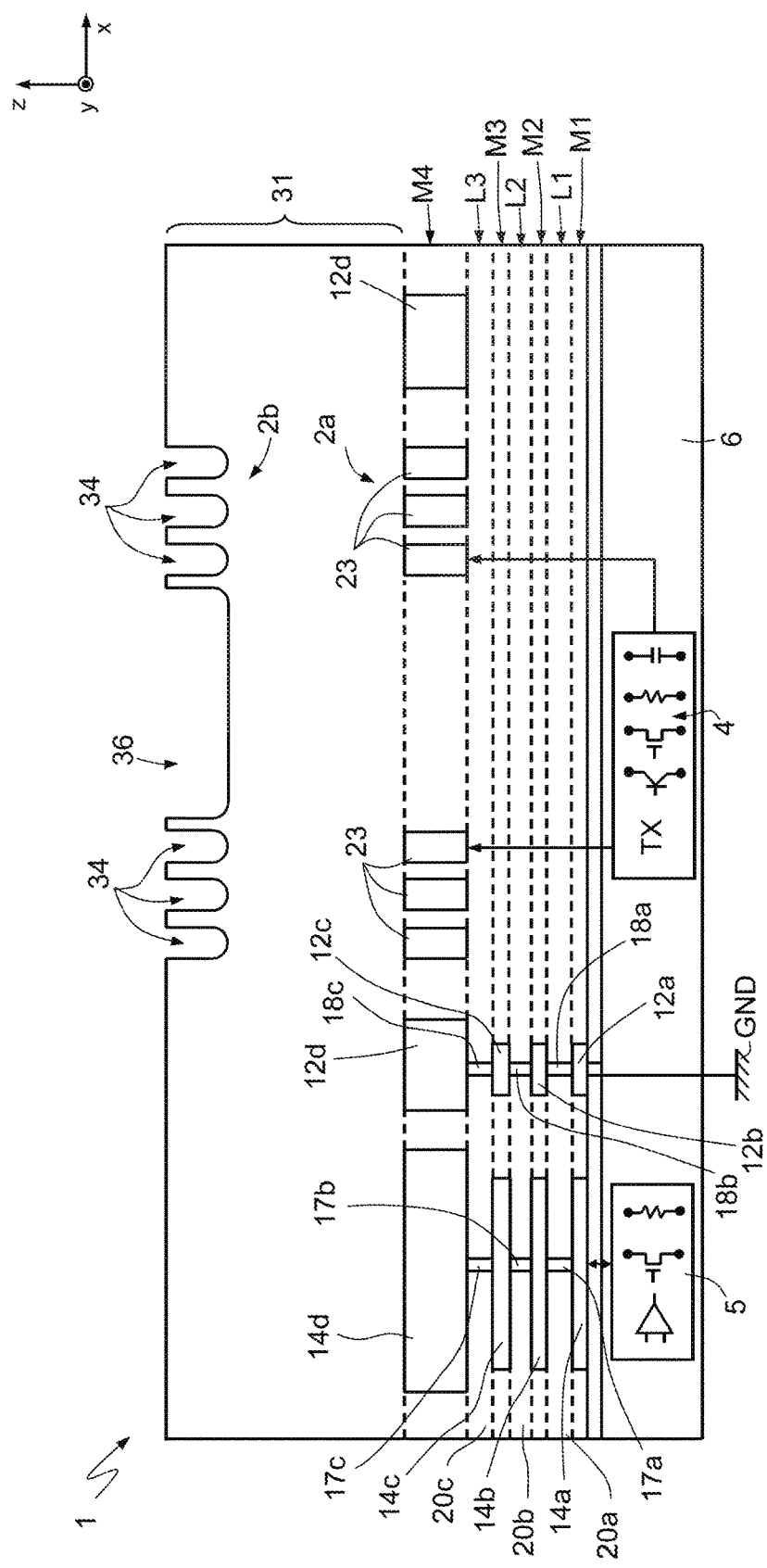
Figure 7:
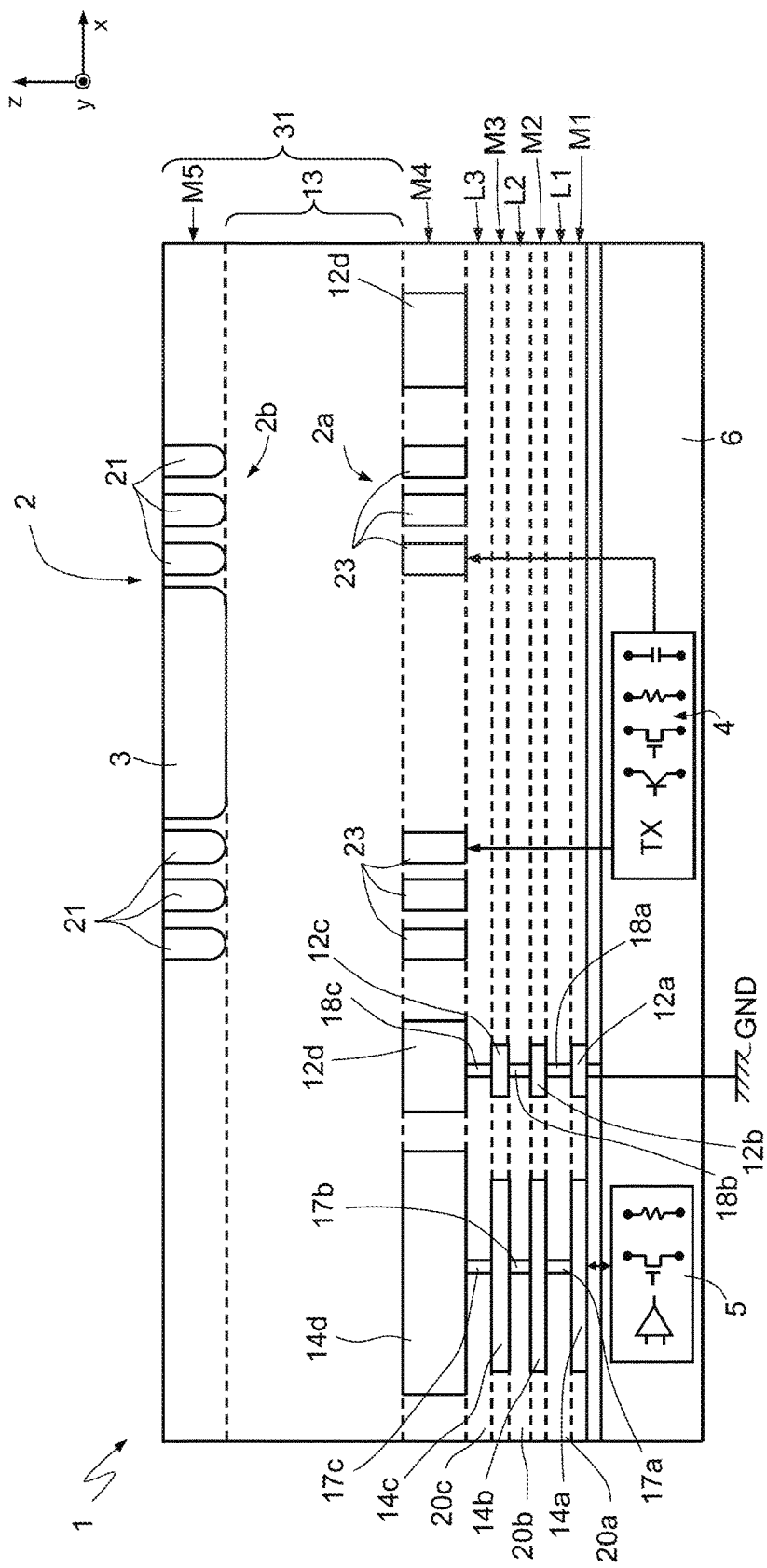
Figure 8:
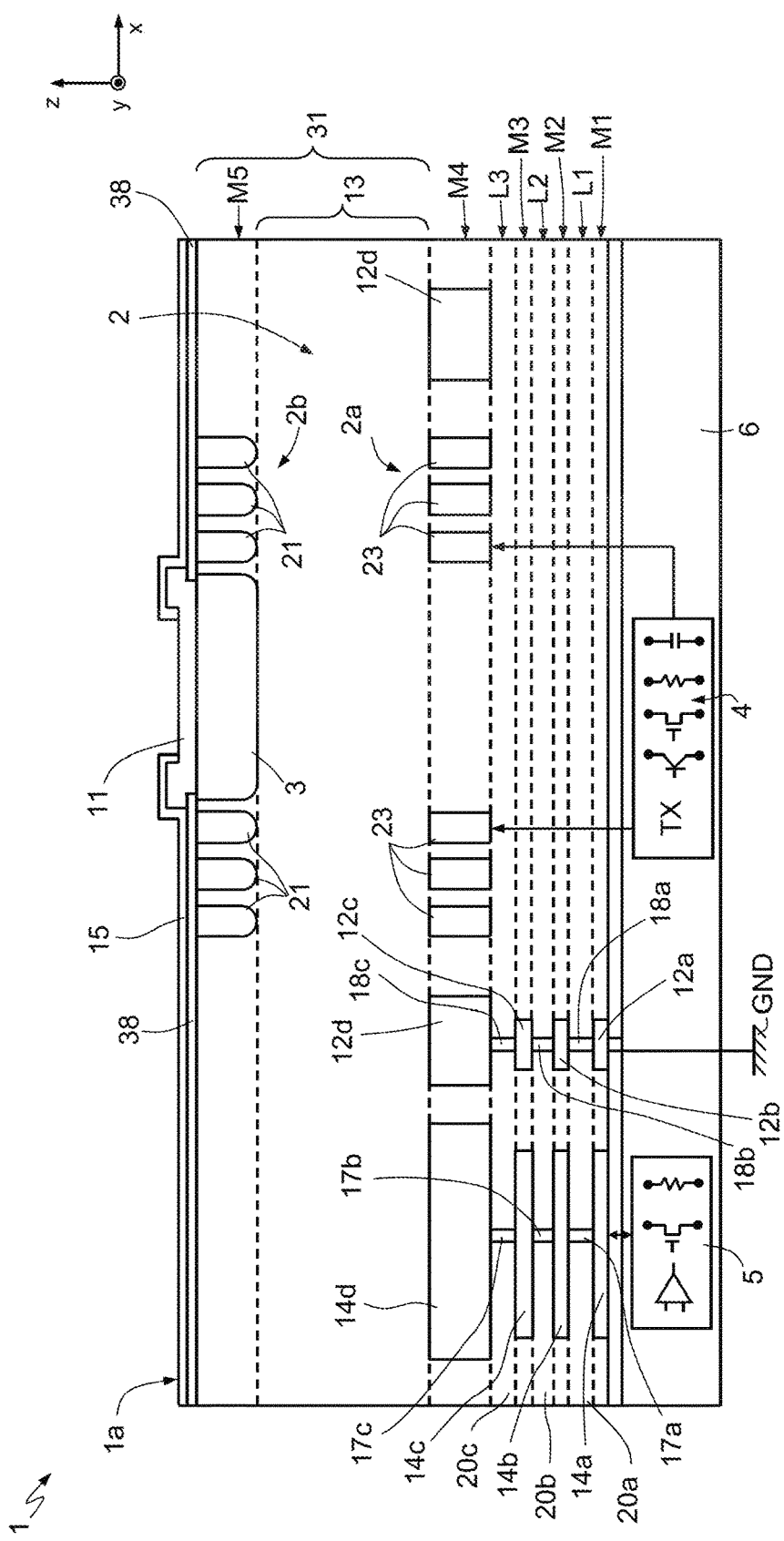
Figure 9:
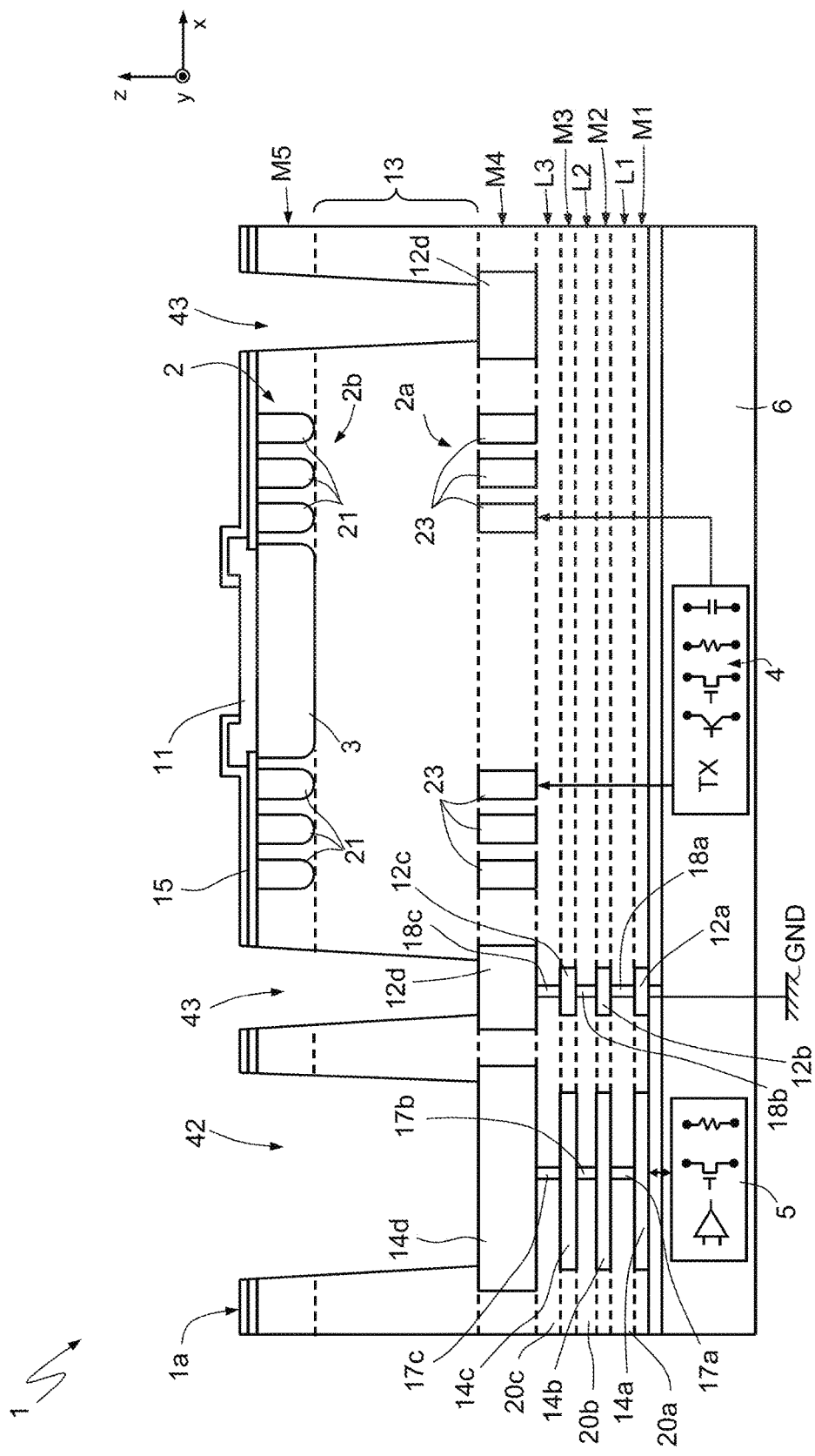
Figure 10:
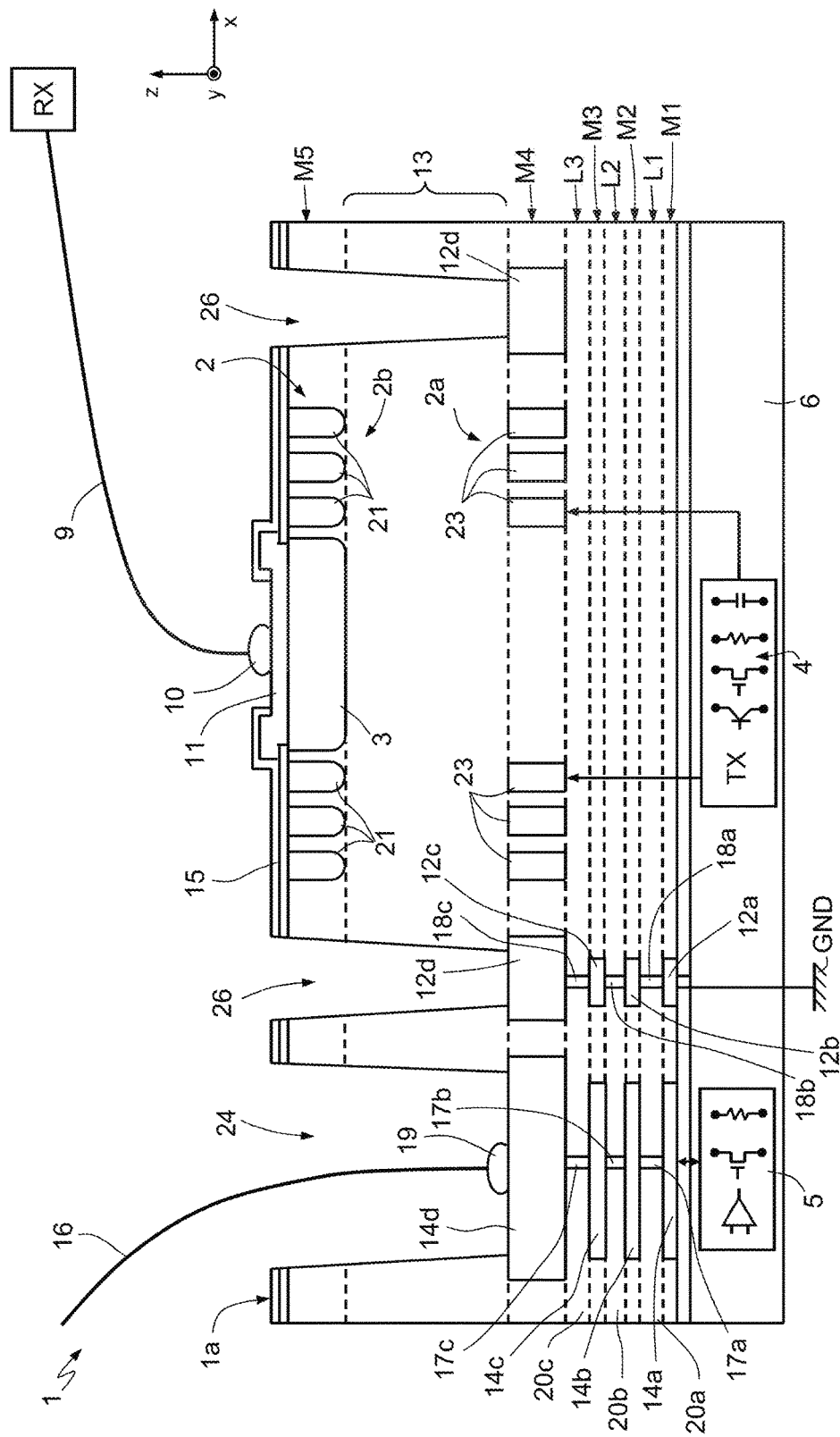

With reference to FIG. 5, the next step is formation of one or more dielectric layers 31 on the device 1, i.e., above the fourth metal level M4. For example, the dielectric layer 31 is a deposited oxide (TEOS oxide). The dielectric layer 31 is deposited between the turns 23 of the bottom winding 2a, and over, and between, the metal regions 12d, 14d. The dielectric layer 31 has a thickness of a few micrometers, for example 10-15 µm or more. The dielectric layer 31 is, for example, silicon oxide ($SiO_2$).

Then (FIG. 6), a step of etching of the dielectric layer 31 is carried out in order to form recesses in surface regions of the dielectric layer 31, in which it is desired to provide the top winding 2b and the electrical-contact region 3.

In particular, a recess 34 is formed, aligned (or substantially aligned), along Z, with the turns 23 of the bottom winding 2a, and a recess 36 is likewise formed extending inside or outside the region delimited by the recess 34. The recess 34 and the recess 36 are in fluid communication with one another. In subsequent manufacturing steps, the recess 34 will house the metallization of the turns 21, and the recess 36 will house the metallization of the electrical-contact region 3. The number and size of the turns 21 may be the same as or else different from the number and size of the turns 23.

Etching of the dielectric layer 31 is carried out using the wet-etching technique. Possibly, a dry etch may precede the wet etch, as described in what follows. Irrespective of the etching technique adopted, the recesses 34 and 36 are formed in such a way that they will have, in lateral sectional view, a U-shaped profile, i.e., with rounded corners at the bottom side, in a way similar (mutatis mutandis) to what has been described with reference to FIG. 3.

A profile of this type may be obtained by appropriately adjusting etching of the dielectric layer 31, according to what is specified hereinafter.

In the case of wet etching, an etching mask is used, formed over the dielectric layer 31, for example according to known lithography and etching steps. In this case, the etching chemistry used is of an isotropic type, i.e., such that the dielectric layer 31 is removed at the same etching rate in all etching directions. For this purpose, a BOE (Buffered Oxide Etch) solution is, for example, used, with a concentration $NH_4F:HF$ of 18:1, with an etching rate of some tens of nanometers per minute (e.g., 250 nm/min). With an etch of this sort, having a duration of approximately 12 min, recesses 34, 36 are obtained having a depth of 3 µm and having rounded corners, with a radius of curvature of approximately 3 µm. The recesses 34, 36 thus formed hence have, in lateral sectional view, rounded corners as envisaged by the present disclosure (see, for example, FIG. 3).

According to a different embodiment for obtaining recesses 34, 36, an approach is used that envisages anisotropic etching, e.g., dry etching, after isotropic etching, e.g., wet etching, for obtaining recesses 34, 36 with non-rounded lateral surfaces thanks to anisotropic etching, but guaranteeing in any case the radius of curvature required for the corners at the bottom of the recesses 34, 36 thanks to the isotropic etch. For this purpose, after an appropriate etching mask has been provided on the surface of the dielectric layer 31, an operation of pre-digging is carried out by dry anisotropic etching (e.g., to a depth of a few micrometers, in particular 1-2 µm), and this is followed by wet isotropic etching (e.g., to a depth of a few micrometers, in particular 1-2 µm). Anisotropic etching of the dielectric layer 31 may be carried out using, for example, a chemical/physical etch with chemistry $CF_4/O_2$; isotropic etching may be conducted using BOE or HF.

Then (FIG. 7), the recesses 34, 36 are filled using a metal material, for example copper.

According to one aspect of the present disclosure, this step may be carried out by depositing a seed layer of copper, followed by electrochemical growth of copper, in a per se known manner. Removal of the copper grown outside the recesses 34 and 36 is carried out using a CMP (Chemical-Mechanical Polishing) technique. The process used for filling the recesses 34 is moreover known as "damascene".

There is thus formed the top winding 2b of the transformer 2, including the metal turns 21 and the electrical-contact region 3, electrically coupled to the turns 21.

Next (FIG. 8), a step of passivation of the exposed surface of the device 1 (formation of the passivation layer 38) is carried out, and then, the passivation layer is removed only in an area corresponding to the electrical-contact region 3, and a step of deposition of an interface metal layer (e.g., of aluminum or of an alloy including aluminum, or of nickel-palladium, etc.) is carried out. The interface metal layer is selectively etched in such a way that it is removed from the surface of the device 1 except for the portion thereof in which the electrical-contact region 3 extends. The coupling interface 11 is thus formed.

Then, a step of formation of the protective dielectric layer 15 is carried out, depositing, for example, silicon oxide and/or silicon nitride and etching the dielectric layer thus deposited for opening a contact at the coupling interface 11.

Next (FIG. 9), the protective dielectric layer 15, the passivation layer 38, and the dielectric layer 31 are etched to form deep trenches 42, 43 that extend until surface portions of the metal regions 14d and 12d, respectively, are exposed.

Next (FIG. 10), coupling steps are carried out by wire bonding, electrically coupling the bonding wire 16 with the metal region 14d, through the bonding region 19, and electrically coupling the bonding wire 9 with the electrical-contact region 3, through the bonding region 10.

Finally, a step of pouring of a resin, for example epoxy resin, makes it possible to provide the layer of resin 30, thus obtaining the device 1 of FIG. 2.

FIG. 11 shows the device 1 in top plan view, according to one embodiment. The cross-sectional view of FIG. 2 is taken along the line of section II-II in FIG. 11; however, for simplicity of representation, the device 1 of FIG. 11 does not comprise the bonding wires 9 and 16 and the layer of resin 30. As may be noted, the device 1 comprises a plurality of metal pads 50 (including the metal region 14d), for electrical wire bonding (not shown in FIG. 11). The metal region 12d in FIG. 2 belongs to an annular path that surrounds the inductor 2, with the advantage of preventing the resin that covers the chip from accumulating electric charges that might disturb operation of the underlying devices 4 and 5. The annular path of the metal region 12d may, for example, be interrupted in one or more points to prevent onset of parasitic currents induced by the magnetic field generated by the windings of the transformer.

In this embodiment, the inductor 2, has two opposed windings, a right-handed one and a left-handed one, electrically connected together. The electrical-contact region 3 and a further electrical-contact region 3' form electrical connection terminals coupled to respective ends of the opposed windings.

From what has been described above, the advantages of the present disclosure as illustrated in the various embodiments are evident.

In particular, rounding of the corners of the top winding 2b enables reduction of the curvature and density of the equipotential lines and consequently reduction of the electrical field. For this reason, as the radius of curvature increases, the likelihood of breakdown of the dielectric is reduced and simultaneously the service life of the device increases.

Finally, it is evident that modifications and variations may be made to the disclosure described herein, without thereby departing from the scope of the present disclosure.

In particular, the present disclosure applies to electrical components other than the micro-inductor described. For example, the inductor 2 may be replaced by a capacitor 60 with plane and parallel faces to provide a coupling of a capacitive type, as shown by way of example in FIG. 12. The bottom and top plates 60a, 60b of the capacitor 60 (integrated in a device, or chip, 1') are of metal material and are obtained according to manufacturing steps similar to those described previously for obtaining the top and bottom windings 2b and 2a of the transformer 2. In particular, the top plate 2b has the same conformation of the corners as already described with reference to the turns 21, i.e., a shape with rounded edges, in order to achieve the same advantages described previously.

Figure 12:
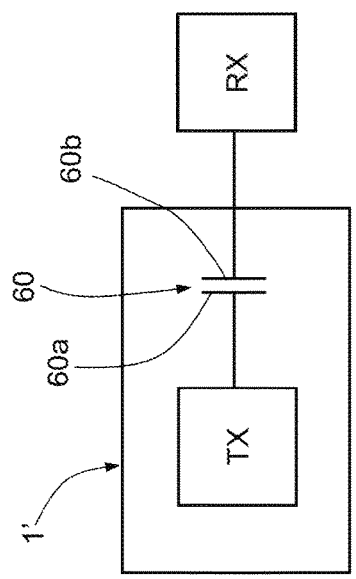
FIG. 12 is a schematic representation of a system that comprises a galvanically isolated coupling module, in particular a capacitor, according to one embodiment of the present disclosure.

In the embodiments of FIGS. 2 and 12, the transmitter TX is shown integrated in the device 1, 1'. It is, however, evident that, according to alternative embodiments, part of the transmitter circuit TX, or the entire transmitter circuit TX, may be provided outside the device 1, 1', and operatively connected to it (and, in particular, to the transformer 2 or to the capacitor according to the respective embodiments) by connections of a known type (for example, by solder bumps provided on the front of the device 1, 1'), or wire bonding, or some other electrical connection still.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an electronic device, the method comprising:
    forming a dielectric layer on a semiconductor body; and
    integrating, in the dielectric layer, a galvanic isolation module, the integrating including forming a first metal region at a first height of the dielectric layer;
        forming a second metal region at a second height greater than the first height of the dielectric layer, said first and second metal regions being at least one of capacitively and magnetically coupleable together, wherein forming the second metal region includes etching selective portions of the dielectric layer to form at least one trench having a side wall coupled to a bottom wall through rounded surface portions; and
        filling said at least one trench with metal material to form the second metal region having rounded edges.

2. The method according to claim 1 wherein etching selective portions of the dielectric layer comprises carrying out an isotropic masked etching of the dielectric layer.

3. The method according to claim 1 wherein forming said trench includes:
    carrying out an anisotropic masked etch of the dielectric layer; and
    carrying out a subsequent isotropic etch to form said rounded surface portions.

4. The method according to claim 3 wherein carrying out said subsequent isotropic etch comprises carrying out said subsequent isotropic etch to obtain, for the rounded surface portions, a radius of curvature between approximately 2 µm and 6 µm.

5. The method according to claim 3 wherein carrying out said anisotropic masked etch defines side walls of the trench that extend in a plane that forms, with a plane of the bottom wall, a right angle or obtuse angle.

6. The method according to claim 2 wherein carrying out said isotropic etch defines a hemispherical profile of the bottom wall and of the rounded surface portions.

7. The method according to claim 6 wherein integrating the galvanic isolation module comprises forming an integrated transformer, and wherein forming the first and second metal regions include forming, respectively, a primary winding and a secondary winding of said transformer.

8. The method according to claim 1 wherein integrating the galvanic isolation module comprises forming an integrated capacitor, and wherein forming the first and second metal regions include forming, respectively, a first plate and a second plate of said integrated capacitor.

9. The method according to claim 1 wherein said electronic device includes an active-area region and wherein forming the galvanic isolation module comprises forming said galvanic isolation module in a position corresponding to said active area.

10. A method, comprising:
forming a dielectric layer over a body, the dielectric layer having a first surface;
forming a first conductive region in the dielectric layer at a first height over the body;
etching selective portions of the dielectric layer to form at least one trench having a side wall coupled to a bottom wall through rounded surface portions; and
forming in the at least one trench a conductive material to form a second conductive region having rounded edges, the second conductive region being formed in the dielectric layer at a second height over the body, the second height being greater than the first height.

11. The method of claim 10 wherein etching selective portions of the dielectric layer comprises:
providing an etching mask on the first surface of the dielectric layer; and
isotropically etching the dielectric layer.

12. The method of claim 10 wherein etching selective portions of the dielectric layer to form the at least one trench comprises:
providing an etching mask on the first surface of the dielectric layer;
anisotropically etching the dielectric layer; and
after anisotropically etching the dielectric layer, isotropically etching the dielectric layer to form the rounded surface portions.

13. The method of claim 12 wherein isotropically etching the dielectric layer to form the rounded surface portions comprises forming rounded surface portions having a radius of curvature between 2 µm and 6 µm.

14. The method of claim 13 wherein anisotropically etching the dielectric layer defines side walls of the at least one trench that extend in a plane and form, with a plane containing the bottom wall, an obtuse angle.

15. The method of claim 14 wherein isotropically etching defines a hemispherical profile for the bottom wall and of the rounded surface portions.

16. The method of claim 10 wherein forming the first and second conductive regions comprises forming a primary winding and a secondary winding, respectively, of an integrated transformer.

17. The method of claim 10 wherein forming the first and second conductive regions includes forming first and second plates, respectively, of an integrated capacitor.

18. A method, comprising:
forming a first metallization layer at a first distance over a body;
forming in the first metallization layer primary windings of an integrated transformer;
forming a dielectric layer over the body and the first metallization layer, the dielectric layer having a first surface; and
forming secondary windings of the integrated transformer in the dielectric layer extending from the first surface, each of the secondary windings being formed at a second distance over the body that is greater than the first distance, and each of the secondary windings having a side wall and a bottom wall with rounded surface portions extending between the side wall and bottom wall.

19. The method of claim 18 wherein forming the secondary windings comprises etching selective portions of the dielectric layer to form trenches in the first dielectric layer, each of the trenches having a side wall, and a bottom wall and rounded surface portion having a hemispherical profile.

20. The method of claim 19 wherein etching selective portions of the dielectric layer comprises wet etching and dry etching the dielectric layer.

\* \* \* \* \*